United States Patent [19]

Chappell et al.

[11] Patent Number: 4,533,940
[45] Date of Patent: Aug. 6, 1985

[54] HIGH SPATIAL RESOLUTION ENERGY DISCRIMINATOR

[76] Inventors: Barbara A. Chappell; Terry I. Chappell, both of RFD Adele Court, Amawalk, N.Y. 10501; Jerry M. Woodall, 336 Cherry St., Bedford Hills, N.Y. 10507

[21] Appl. No.: 503,945

[22] Filed: Jun. 13, 1983

[51] Int. Cl.³ .............................................. H04N 9/04
[52] U.S. Cl. ........................................ 358/44; 357/31
[58] Field of Search ...................... 358/41, 42, 43, 44; 357/12, 24, 30, 31, 29, 32; 250/211 T

[56] References Cited

U.S. PATENT DOCUMENTS

| | | |
|---|---|---|
| 454,784 | 12/1882 | Chappell et al. |
| 3,617,753 | 11/1971 | Kato et al. ........................ 250/211 J |
| 3,649,889 | 3/1972 | Hart ................................ 317/235 R |
| 3,717,724 | 2/1973 | Montgomery ......................... 358/44 |
| 3,860,956 | 1/1975 | Kubo et al. ............................ 358/48 |
| 3,955,082 | 5/1976 | Dyment ......................... 250/211 J |
| 4,229,754 | 10/1980 | French .................................. 357/30 |
| 4,255,760 | 3/1981 | Zeitzoff ................................. 358/41 |
| 4,412,236 | 10/1983 | Sasano .................................. 357/31 |
| 4,504,846 | 3/1985 | Chappell et al. ....................... 357/12 |

FOREIGN PATENT DOCUMENTS 2315054 10/1974 Fed. Rep. of Germany.
1597740 9/1981 United Kingdom.

OTHER PUBLICATIONS

Electronics/Sep. 8, 1981, "Optical AND Gate Has Current Output" by Hindin et al., pp. 42,44.
Electronics Letters Oct. 23, 1980, vol. 16, No. 22, "Planar-Doped Barriers in GaAs by Molecular Beam Epitaxy" by Malik et al., pp. 836-837.
ISSCC 80 Digest of Technical Papers, 1980 IEEE International Solid-State Circuits Conf., pp. 26-27, "MOS Color Imaging Device" by Aoki et al.
Textbook, "Charge Transfer Devices" by Sequin et al., published by Academic Press, Inc., 1975, Chapter V, p. 142.

Primary Examiner—Michael A. Masinick

[57] ABSTRACT

An energy discriminator is provided wherein energy, entering through a receiving surface into a multilayer semiconductor monocrystalline body is converted into hole-electron pair carriers in different particular energy responsive layers and the electrons thereof are collected in potential wells that are asymmetric to electron flow associated with the particular layer.

12 Claims, 8 Drawing Figures

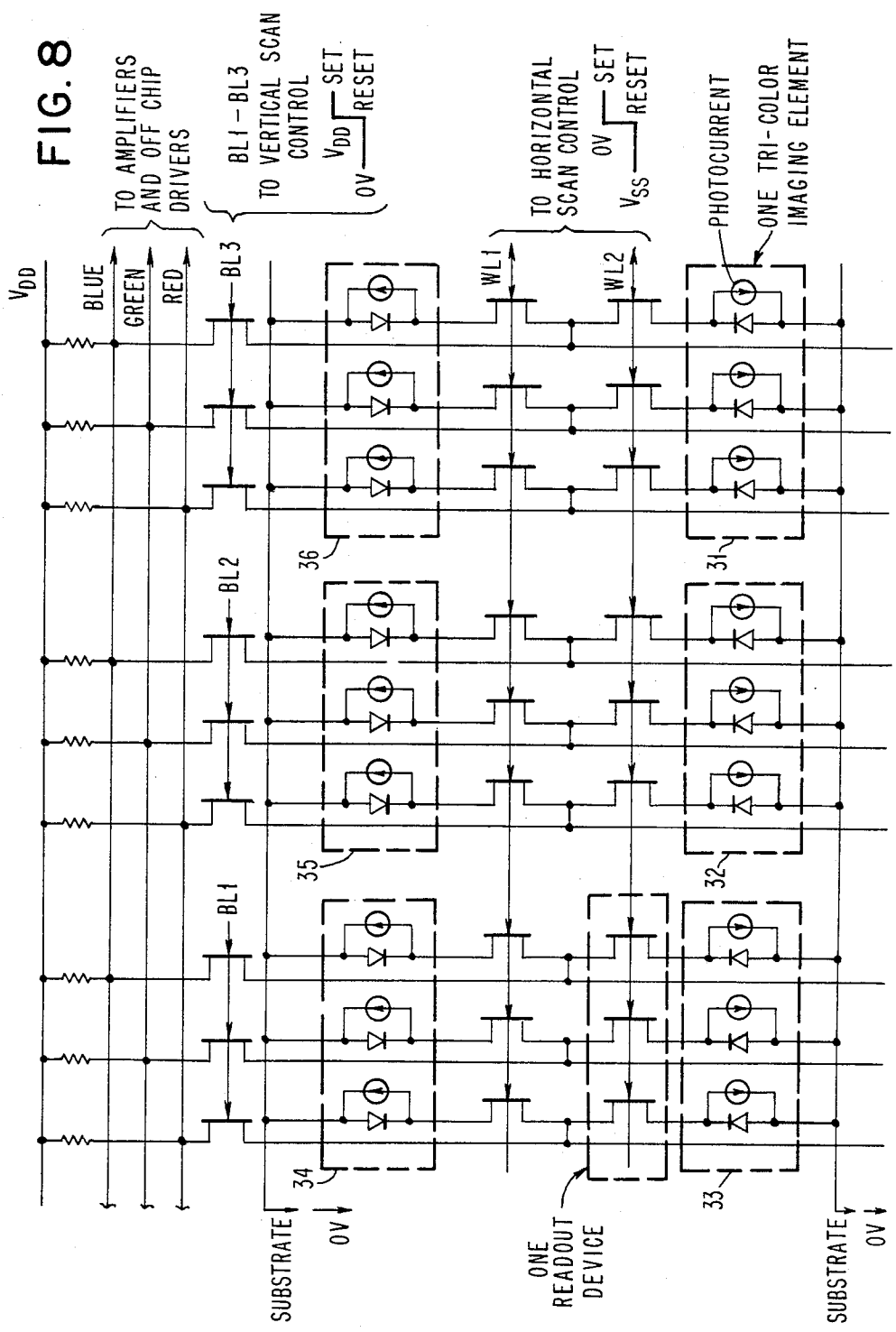

HIGH SPATIAL RESOLUTION ENERGY DISCRIMINATOR

DESCRIPTION

1. Technical Field

One of the principal applications of energy discriminating devices is in separating in electrical output different energy components of an energy beam. Two of the principal applications for these devices are as particle energy beam discriminators and as devices such as vidicons, that can separate the increments in a pictorial energy beam.

2. Background Art

In devices of the type of this invention, it is desirable to have a high density of elements capable of responding to a particular energy while at the same time minimizing cross signal transmission between sensitive regions. This is most efficiently achieved in integrated semiconductor devices and the present state of the art is most illustratively defined by the solid state vidicons used to convert a pictorial matrix of light into an electrical signal.

Semiconductor integrated optical-to-electrical converters are shown in U.S. Pat. Nos. 3,860,956 and 3,617,753 wherein p-n junctions are placed side by side at different depths in accordance with the light wavelength of the three primary colors. Structures of this type however have density limits or limits on the closeness to which the individual light sensitive elements or pixels can be positioned and such structures also have limits on the efficiency of the light-to-electrical energy conversion so that in turn the type of output that is compatible with the signals is limited.

BRIEF DESCRIPTION OF THE DRAWINGS

FIGS. 2, 3, 4 and 5 are a correlated set of figures wherein FIG. 2 is a three-dimensional view of the structure of the invention, FIG. 3 is a view of the vertical doping profile of FIG. 2 along the line AB or CD, FIG. 4 is an energy diagram along line AB of FIG. 2 and FIG. 5 is an energy diagram along line CD in the reverse biased condition.

FIG. 8 is a schematic of an electrical circuit diagram showing an x-y scanned diode readout wiring as would be employed for two rows of three each of the tri-color imaging elements as shown in FIG. 6.

DISCLOSURE OF THE INVENTION

An energy discriminator is provided wherein energy, entering through a receiving surface into a multilayer semiconductor monocrystalline body with highly doped narrow regions at the interfaces of the layers, is converted into hole-electron pair carriers in different particular energy responsive layers and the electrons are collected in electron wells in the structure. The electron wells are produced by using such techniques as varying the doping or varying the band gap or both to cause the valence and conduction band energy levels to exhibit localized regions that are close to the Fermi level. The discriminator structure of the invention spatially separates the carriers produced by different energy components in a single energy beam.

While the principles of the invention may be applied to accomplish energy beam to electrical signal conversion for any multicomponent energy beam by spatially separating in electron wells in the monocrystalline body the electrons produced by the component energy, the requirements of the color vidicon are a particularly stringent application and will be used in a detailed description.

In the color vidicon application, the structure of the invention provides optical absorption that is different for different colors all received through the same surface increment in a vertically aligned arrangement. In the structure the light beam passes through the pixel increment of the surface and carriers produced by photons of the different color light energies are collected in separate potential wells for identification in the electric output signal. High optical efficiency is achieved with rapid carrier transport so that the structure is adaptable to more than one type of output.

Figure 1:
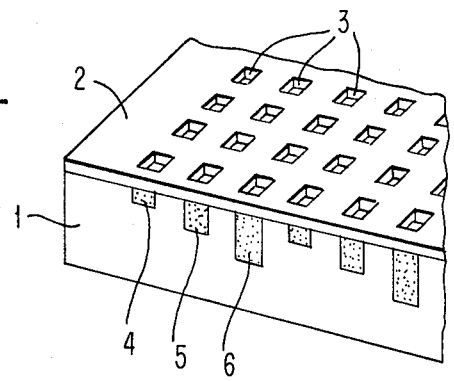
FIG. 1 is an illustration of a prior art type of integrated solid state optical-to-electrical converter.

Referring to FIG. 1, there is shown a three-dimensional illustration of a prior art type semiconductor integrated optical-to-electrical converter. In the structure of FIG. 1, a substrate 1 is provided with a light receiving broad area surface covered with an opaque covering 2 having a plurality of openings 3 each positioned to admit light to a particular semiconductor p-n junction, three of which 4, 5 and 6 for the three basic colors are positioned at progressively greater depths for progressively longer wavelengths. The structure of FIG. 1 in being responsive to light of different wavelengths is so arranged that groups of three p-n junctions such as the 4, 5 and 6 combination can serve as a tricolor pixel.

Figure 2:
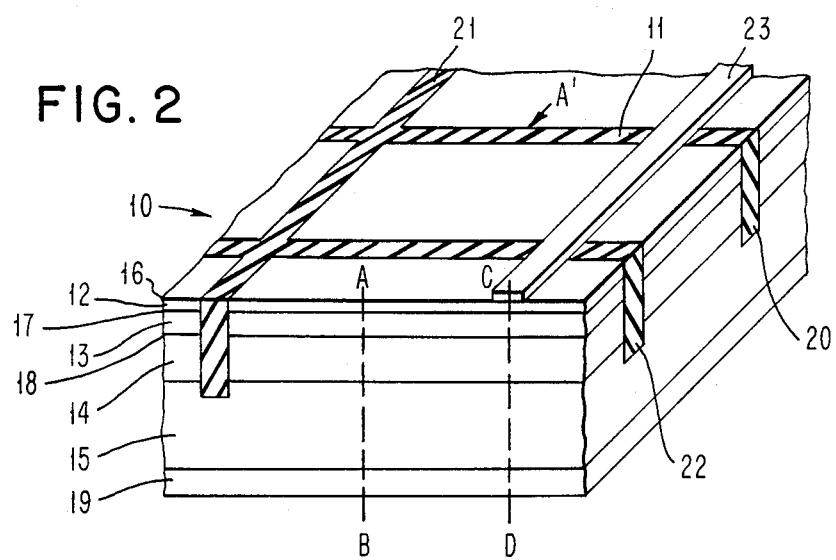

A cross-sectional view of the invention is shown in FIG. 2. Referring to FIG. 2 the body 10 is a monocrystalline semiconductor with the property of high electro-optical conversion such as GaAs and has a plurality of layers parallel to an upper or light incident surface 11. The layers are semiconductor regions 12, 13 and 14, on a substrate 15, having respectively, progressively larger thicknesses with distance from the light incident surface 11, each layer having an interface region with respect to the adjacent layer in which the potential well is located labelled 16, 17 and 18, respectively. A metal back contact member 19 is provided for biasing the substrate. Isolating members 20, 21 and 22 respectively of, for example p+ conductivity, are provided sufficient to reach levels that prevent cross signal influence. A gate such as a Schottky barrier rectifying contact electrode 23 is provided for controlling electrical readout of the signals collected in regions 16, 17 and 18.

The structure of FIG. 2 is constructed so that energy increments, which shall be called photons, enter in a beam through the surface 11 are selectively converted to hole-electron pairs at layers of different depths with different wavelength responsiveness with distance from the surface. The electrons in each layer are retained in a potential well constructed in the layer as described in connection with FIGS. 3, 4 and 5.

At each interface 16–18 between the layers 12–14 there is a narrow highly doped region with a width of the order of the mean free path of an electron which for GaAs is about 50Å. The narrow region operates to move the energy bands with respect to the Fermi level and produces the localized energy regions close to the Fermi level.

Figure 3:
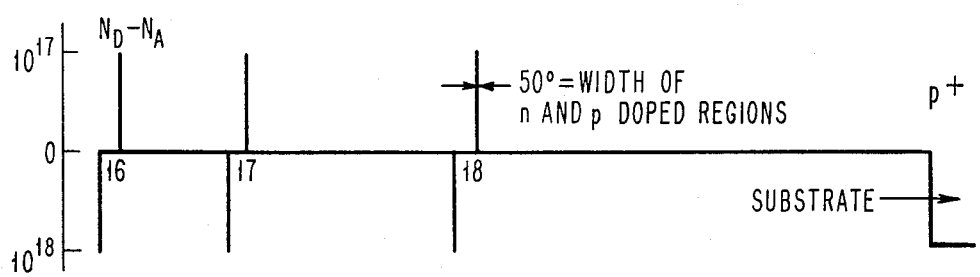

Referring to FIG. 3, a doping profile diagram along the lines AB or CD of FIG. 2 is shown to illustrate these thin highly doped regions. The body 10 is essentially undoped or lightly n doped. The planar doped n+ and p+ regions are each about only 50 Angstroms wide and are doped to of the order of $10^{17}$ to $10^{18}$, having a thickness in the vicinity of the mean free path of an electron. The approximate location of the interfaces 16, 17 and 18, respectively, are labeled 16, 17 and 18 on the diagrams in FIGS. 3, 4 and 5.

Figure 4:
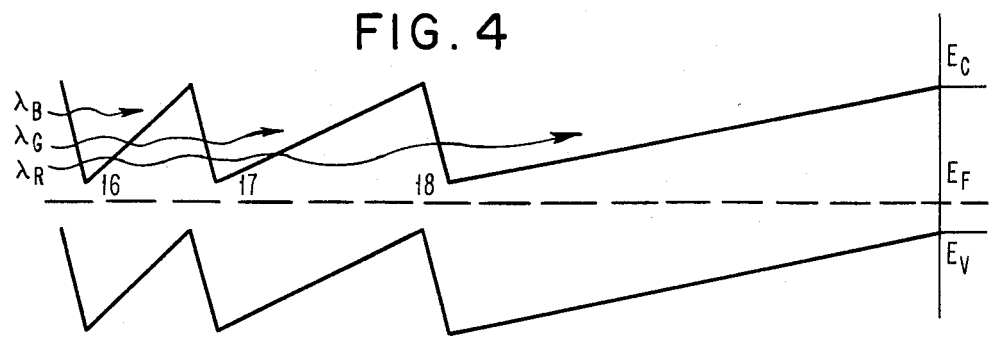

The light or intrinsic doping of the regions 12 to 14 bounded by the narrow heavy doping at the interfaces 16, 17 and 18 operate to produce the energy levels as are illustrated in FIG. 4. In FIG. 4, the energy band diagram along the line AB of FIG. 2 is such that energy wells are provided in the vicinity of interfaces 16, 17 and 18.

The Fermi level is flat in the dark and when light enters through surface 11, short wavelength blue photons provide electrons which are stored in the well in the interface 16 locality while similarly, the green and the red wavelength photons provide electrons which are stored in wells in the vicinity of interfaces 17 and 18, respectively.

Figure 5:
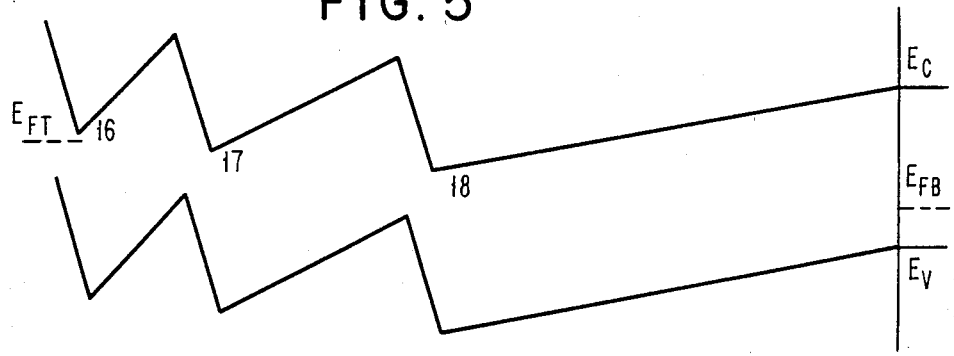

Referring next to FIG. 5, which is an energy diagram taken along the line CD of FIG. 2 the effect of a reverse bias on the Schottky barrier rectifying electrode 23 is illustrated. Under the bias, the Fermi level, labeled $E_{FT}$, is now higher at the light entry surface 11. The potential level of each of the collection wells in the vicinity of 16, 17 and 18 is thus higher than each well is along the line AB of FIG. 2. This situation operates to confine the electrons stored in the three wells until read-out when the bias on the Schottky gate is reduced.

The bias voltage applied between the substrate back contact 19 and the contact 23 that is to be reduced for read-out is determined by the relationship expressed in Equation 1.

Eq. 1 $V_R = (E_{FT} - E_{FB})/q$ where $V_R$ is of the order of 1 volt $(E_{FT} - E_{FB})$ is of the order of 1 electron volt, and q is $1.6 \times 10^{-19}$ coulombs Each of the regions 12, 13 and 14, bounded by the doped regions at the interfaces 16, 17 and 18, have a dimension in the direction of the incident light selected such that maximum carriers are produced by the particular wavelength for that region. As an example, for GaAs appropriate thicknesses would be for layer 12 about 0.025 micrometers, for layer 13 about 0.175 micrometers and for layer 14 about 1.3 micrometers, for wavelengths of 0.400 micrometers, 0.525 micrometers and 0.730 micrometers, respectively.

As may be seen from the previous description, the structure of the invention senses many colors per element whereas the prior art in FIG. 1 requires a separate element for each color. This is a substantial benefit because in the prior art spatial resolution and energy resolution were a trade-off, whereas in the structure of the invention, there is no loss in resolution as energy discrimination increases.

In operation, the structure of the invention provides a field that accelerates carriers produced by the specific light wavelengths. These conditions in combination permit drift rather than diffusion to be the dominant carrier transport mechanism and carrier transport delays are minimized. The heavily doped boundaries provide low impedance to the transport of the carriers and are thin enough so that no significant delay is introduced.

The optical-to-electrical converter of this invention provides in a semiconductor structure serially positioned with respect to a light receiving surface, a region tailored to convert and store in a potential well carriers produced by photons of each wavelength in the incident light. The structure is particularly adaptable to integration and the three primary color wavelengths have been used as an example. A high field is produced in each essentially undoped region being bounded by thin highly doped interfaces. The high field in turn accelerates the carriers produced by the particular wavelength. The undoped or lightly doped condition of the region also minimizes carrier scattering as the light produced carriers move. The tolerance on the thickness dimension of each region is quite liberal and is generally long enough to provide the maximum carriers produced by the light wavelength for that region.

These conditions permit drift rather than diffusion to be the dominant carrier transport mechanism and the heavily doped interface boundaries are so thin that no significant delay is introduced. The combination of all the structural features of the invention operate to provide higher integration and simpler readout.

BEST MODE FOR CARRYING OUT THE INVENTION

The structure of the invention has output signal properties so strong that it is adaptable to various types of readout techniques. Heretofore in the art, the charge coupled device (CCD) type readout has been used more frequently wherein the output from each element enters a planar array and the signal from the array elements is propagated serially. The clocking of this type of array is somewhat complex.

The preferred embodiment for this invention, chosen for simplicity, involves an x-y scanning array wherein no complex clocking is required.

Figure 6:
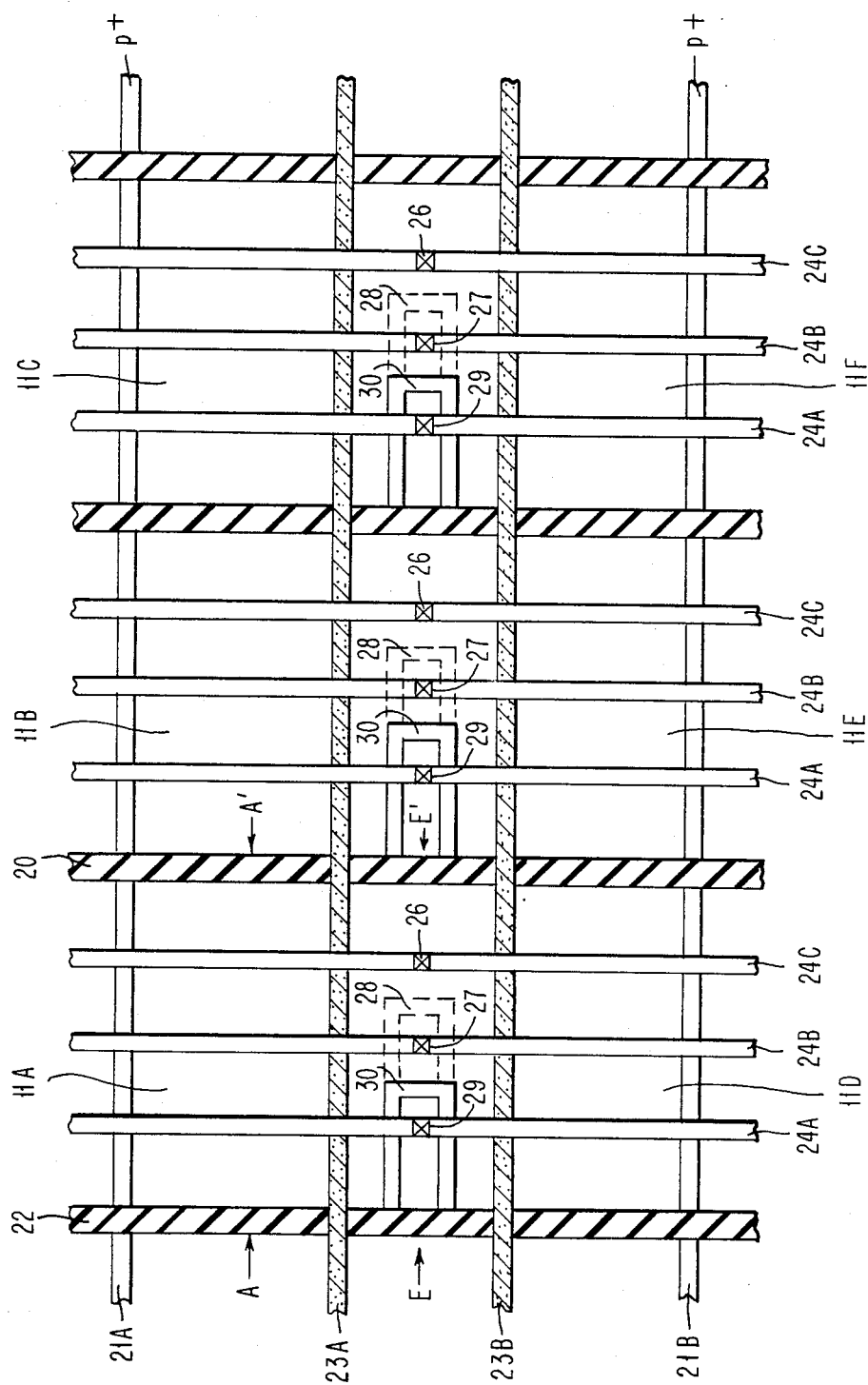
FIG. 6 is a top view of an integrated version of two rows of three tri-color imaging elements in each row in an x-y scanned diode array embodiment of the invention and illustrating the location of section A—A' of FIG. 2 and E—E' shown in FIG. 7.

Referring to FIG. 6, there is shown a plan view of a portion of an array of the preferred x-y scanned imaging device illustrating two rows of three pixels each as in FIG. 2 using the reference numerals of FIG. 2. A single readout is provided for each pair of pixels.

Each of the six light receiving areas 11A to 11F has three outputs 24A for red, 24B for green and 24C for blue. The blue or shorter wavelength output makes ohmic contact to the electron well in layer 12 of FIG. 2 at element 26, the green or intermediate wavelength output makes ohmic contact to the electron well in layer 13 of FIG. 2 at element 27 with isolation 28 shown dotted through the electron well in layer 12 and the red or longer wavelength output makes ohmic contact to the electron well in layer 14 of FIG. 2 at element 29 with isolation shown solid as element 30 through the electron well in layer 13 of FIG. 2.

The light receiving areas of the pixels are bounded by isolation areas of p+ labelled as in FIG. 2 elements 20, 22 and 21A and 21B. Readout of pixels 11A, 11B and 11C or 11D, 11E and 11F are controlled by output gates of the Schottky barrier type 23A and 23B, respectively.

Figure 7:
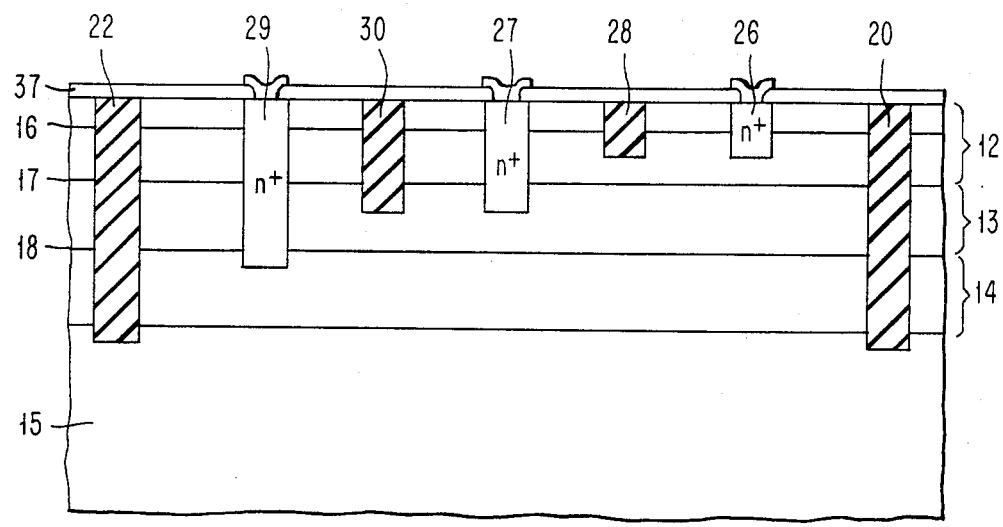
FIG. 7 is a cross-sectional view of the substrate of FIG. 6 along line E—E' showing electrode placement, penetration and isolation for the invention.

The connections are shown in FIG. 7 in cross-section along the lines E—E' of FIG. 6 where each readout contact 26, 27 and 28 penetrates to the respective layer 12, 13 and 14 with isolations 28 and 30 penetrating to the respective layers 12 and 13. Over the structure an insulating transparent layer 37 is provided to prevent the lines 24A to 24C of FIG. 6 from electrically contacting the surface except at 26, 27 and 29.

Referring next to FIG. 8, a schematic functionally labelled diagram of the wiring and controls is shown for six of the type of tricolor elements in FIGS. 6 and 7 labelled 31 to 36. Conventional symbols of oppositely poled diodes and current sources for back current and photocurrent in light conversion are used. Field effect transistors are used for control switches. The horizontal and vertical scan controls are labelled with signal levels. There are two horizontal scan controls $WL_1$ and $WL_2$ the function of which is to provide access to tricolor elements 34, 35 or 36 and 31, 32 or 33, respectively. There are three vertical scan controls $BL_1$, $BL_2$ and $BL_3$, the function of which is to provide access to tricolor elements 34 or 33, 35 or 32 and 36 or 31, respectively. Through the application of the appropriate control signals to the horizontal and vertical scan controls, each tricolor element of the 2×3 array illustrated here can be separately interrogated.

If a charge coupled device type of readout were to be desirable, a few modifications would improve performance.

The structure of FIG. 2 would be modified in the following way. A transparent indium tin oxide ($InSnO_2$) electrode would be placed over the light receiving region surface 11. This would be biased to drive each element of the array as an imaging element into deep depletion of carriers during integration of the incident light and for biasing during read-out for more complete charge transfer. An $n^+$ region would be included in the isolation regions 20, 21 and 22 for collection of laterally diffusing carriers thereby reducing the tendency to "wash out" defined edges. This tendency in the prior art has been identified by the term "blooming." Lastly, a simple standard two-phase charge coupled device clocking and segmented array would be employed to improve transfer rate and transfer efficiency.

In other words, the CCD structure in order to improve dark current control would use a high band gap material such as GaAs. It achieves better blooming protection through the use of the shorter diffusion lengths of that material and the structure is modified with the $InSnO_2$ layer to provide complete depletion of the individual layers when the access bias is on.

While the invention has been described in connection with the formation of potential wells by doping, it will be apparent to one skilled in the art that the potential well principle could be achieved by other methods such as for example the use of heterojunctions at the interfaces of the layers along with the grading of the band gap in the layers to prevent carrier flow in the opposite direction from the contact for the layer.

What has been described is an energy discriminator wherein energy, entering through a receiving surface into a multilayer semiconductor monocrystalline body with highly doped narrow regions at the interfaces of the layers, is converted into hole-electron pair carriers in different particular energy responsive layers and the electrons are collected in electron wells in the structure.

The principle of the invention is illustrated in an integrated color vidicon structure.

Having thus described our invention, what we claim as new and desire to secure by Letters Patent is:

1. An energy discriminator of the type wherein a beam of energy is received through a receiving surface of a multi-parallel layer, monocrystalline semiconductor body, each layer thereof being responsive to a particular energy component of said beam by forming hole electron pair carriers therein, the improvement comprising means for producing in said monocrystalline semiconductor body an electron retaining potential well associated with each layer of said body, said means having an asymmetric barrier to electron flow, and readout means transferring the charge from said retained electrons into an output signal.

2. The discriminator of claim 1 wherein said means for producing said potential wells is a low conductivity for each layer with a thin highly doped p and a thin highly doped n region adjacent the interface between said layers.

3. The discriminator of claim 2 wherein said readout means is a bias signal on a gating contact.

4. The discriminator of claim 3 wherein said semiconductor body is low conductivity GaAs and said highly doped p and n regions are doped of the order of $10^{17}$ atoms per cc.

5. An optical-to-electrical signal conversion device comprising in combination
   a monocrystalline semiconductor body having a plurality of planar essentially undoped layers essentially parallel to a light incident surface,
   each said layer bounded by a thin heavily doped p and a thin heavily doped n region of a thickness of the order of the mean free path of an electron, and
   a read out electrode forming an ohmic contact to each layer.

6. The device of claim 5 wherein each said region has a thickness dimension corresponding to favored efficiency for a particular light wavelength.

7. An array of devices of claim 5 wherein carrier migration isolation is provided surrounding each device of said array.

8. The device of claim 7 wherein said semiconductor is GaAs and each thin highly doped region is 50Å wide.

9. The device of claim 7 wherein there are three layers each for the colors red, green and blue, said thickness dimension of the red absorbing region most remote from the light incident surface being 1.3 micrometers, the thickness dimension of the green absorbing region next less remote from said light incident surface being 0.175 micrometers and the thickness dimension of said blue absorbing region being 0.025 micrometers.

10. A color vidicon comprising in combination a plurality of color pixels, each pixel comprising a three essentially parallel layer monocrystalline semiconductor body, each layer thereof being primarily responsive to one of red, green and blue light wavelength by forming hole-electron pair carriers therein, an electron retaining potential well associated with each said layer, said electron retaining potential well being asymmetric to electron flow, and readout means transferring the charge from said retained electrons in each said pixel to an output signal, said transfer means including gating means and vertical and horizontal scan controls.

11. The vidicon of claim 10 wherein adjacent rows of said pixels have adjacent pairs of horizontal scan lines.

12. The vidicon of claim 11 wherein each column of said pixels has a separate vertical scan control for each primary color.

* * * * *

UNITED STATES PATENT AND TRADEMARK OFFICE
CERTIFICATE OF CORRECTION

PATENT NO. : 4,533,940

DATED : August 6, 1985

INVENTOR(S) : Barbara A. Chappell, Terry I. Chappell and Jerry M. Woodall

It is certified that error appears in the above-identified patent and that said Letters Patent is hereby corrected as shown below:

First page, left hand column, please insert in the lines in between "[76] Inventor:..." and "[21] Appl. No.: 503,945"
--Assignee: International Business Machines Corporation, Armonk, New York--

First page, right hand column, please insert on the line before [57]
--Attorney, Agent or Firm -- Alvin J. Riddles--.

Signed and Sealed this

Twenty-sixth Day of November 1985

[SEAL]

Attest:

Attesting Officer

DONALD J. QUIGG

Commissioner of Patents and Trademarks